(12) United States Patent
Abdul Karim et al.

(10) Patent No.: US 9,105,825 B2
(45) Date of Patent: Aug. 11, 2015

(54) LIGHT SOURCE PACKAGE AND METHOD OF MANUFACTURING THE SAME

(71) Applicant: Avago Technologies General IP (Singapore) Pte. Ltd., Singapore (SG)

(72) Inventors: Norfidathul Aizar Abdul Karim, Penang (MY); Chiau Jin Lee, Penang (MY); Kheng Leng Tan, Penang (MY)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 73 days.

(21) Appl. No.: 13/908,860

(22) Filed: Jun. 3, 2013

(65) Prior Publication Data

US 2014/0353701 A1     Dec. 4, 2014

(51) Int. Cl.
*H01L 33/62* (2010.01)
*H01L 33/60* (2010.01)
*H01L 33/50* (2010.01)

(52) U.S. Cl.
CPC .............. *H01L 33/62* (2013.01); *H01L 33/60* (2013.01); *H01L 33/504* (2013.01); *H01L 33/507* (2013.01)

(58) Field of Classification Search
CPC ....... H01L 33/62; H01L 33/486; H01L 33/54; H01L 33/60
See application file for complete search history.

(56) References Cited

U.S. PATENT DOCUMENTS

| 7,692,206 B2 | 4/2010 | Loh |
| 8,138,517 B2 | 3/2012 | Chiu et al. |
| 8,324,646 B2 | 12/2012 | Lee et al. |
| 2008/0038853 A1* | 2/2008 | Park et al. .................. 438/26 |
| 2012/0080701 A1* | 4/2012 | Kim et al. .................. 257/98 |

OTHER PUBLICATIONS

"Opto Hybrid Features", Optek Technology, Inc., 48 E D, 6798580 0001281 096, T-42-81, 15 pages.

* cited by examiner

*Primary Examiner* — Whitney T Moore (57) ABSTRACT

A package for a light source is disclosed. In particular, a Plastic Leaded Chip Carrier (PLCC) is described which provides enhanced heat dissipating properties. Moreover, the PLCC is described as comprising a single-gage leadframe, which provides for enhanced design flexibility and reduced manufacturing costs. Methods of manufacturing light source packages are also disclosed.

20 Claims, 10 Drawing Sheets

LIGHT SOURCE PACKAGE AND METHOD OF MANUFACTURING THE SAME

FIELD OF THE DISCLOSURE

The present disclosure is generally directed toward light emitting devices and packages for the same.

BACKGROUND

Light Emitting Diodes (LEDs) have many advantages over conventional light sources, such as incandescent, halogen and fluorescent lamps. These advantages include longer operating life, lower power consumption, and smaller size. Consequently, conventional light sources are increasingly being replaced with LEDs in traditional lighting applications. As an example, LEDs are currently being used in flashlights, camera flashes, traffic signal lights, automotive taillights and display devices.

Among the various packages for LEDs, an LED package of interest is the Plastic Leaded Chip Carrier (PLCC) package for a surface mount LED. Surface mount LEDs in PLCC packages may be used, for example, in automotive interior display devices, electronic signs and signals, and electrical equipment.

A common high-power PLCC package utilizes a dual-gage leadframe. This type of PLCC package is relatively efficient at dissipating heat to an underlying Printed Circuit Board (PCB). However, dual-gage leadframes are far more expensive than single-gage leadframes. Moreover, the dual-gage leadframe is not very flexible (e.g., bendable, malleable, etc.), especially when compared to a single-gage leadframe. This lack of flexibility means that the dual-gage leadframe material is only suitable for specific package designs.

Another design that is used for high-power PLCC packages is to insert a separate metal slug between the PCB and light source. The metal slug is separate from the leadframe that is used to carry current to/from the light source(s). This separate metal slug significantly increases the costs of the package.

Currently-available PLCC packages that utilize a single-gage leadframe are simple in the leadframe design. Specifically, the single-gage leadframe designs tend to be relatively flat, which means that interconnections between the leadframe and the plastic housing of the package are not optimal. Therefore, currently-available PLCC packages having a single-gage leadframe design are somewhat unreliable and/or prone to failure.

BRIEF DESCRIPTION OF THE DRAWINGS

The present disclosure is described in conjunction with the appended figures.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

In some embodiments, a light source package is realized that combines the advantages of dual-gage leadframes and heat slugs (e.g., good thermal dissipation) along with the advantages of single-gage leadframes (e.g., good flexibility and lower cost).

Embodiments of the present disclosure provide a light source package with a single-gage leadframe that is capable of providing excellent heat dissipation. It is another aspect of the present disclosure to provide a light source package in which phosphor can be isolated from heat generated by a light source.

In some embodiments, a light source package is disclosed which includes a single-gage leadframe and a housing, the single-gage leadframe having a bonding pad with a top surface and opposing bottom surface, at least one light source being mounted on the top surface and the bottom surface being exposed through a bottom face of the housing. Because the bottom surface of the single-gage leadframe is exposed through the housing, heat generated at the light source can travel directly through the single-gage leadframe from the top surface to the bottom surface where the heat can be further dissipated to a second heat-dissipating material (e.g., PCB).

It is one aspect of the present disclosure to provide a light source package which creates an efficient thermal path to dissipate heat from a light source away from the light source. In some embodiments, the light source is mounted directly only a single-gage leadframe and the single-gage leadframe provides a direct thermal path to a secondary level (e.g., PCB). Thus, a single-gage leadframe is disclosed that comprises the beneficial heat-dissipating properties of a dual-gage leadframe and/or heat slug.

It is another aspect of the present disclosure to provide a leadframe that has better thermal conductivity than ceramic materials and is lower cost than said ceramic alternatives.

It is another aspect of the present disclosure to utilize manufacturing method in which the single-gage leadframe can be stamped and punched, thereby minimizing manufacturing costs.

While illustrative examples will be discussed in connection with a particular package construction, it should be appreciated that embodiments of the present disclosure are not so limited. Specifically, although a light source package 100 is depicted and described as a PLCC package having a conventional C-bend lead, embodiments of the present disclosure are not so limited. In particular, embodiments of the present disclosure can be utilized in any type of known PLCC package and/or light packaging platform. Specifically, any type of PLCC package and/or platform or similar type of package for a light emitting device that uses a plastic molded lead frame can incorporate one or more features disclosed herein. Suitable types of PLCC packages that may incorporate embodiments of the present disclosure include, without limitation, a Moonstone Package which has one or more leads protruding to its side, an L-bend PLCC, a PLCC with one or more leads protruding from its bottom, and so on. In some embodiments, the PLCC package may be manufactured according to the industry standard PLCC-4. It should also be appreciated that non-PLCC packages may also utilize features disclosed herein without departing from the scope of the present disclosure.

Referring now to FIGS. 1-6B, examples of a light source package 100 will be described in accordance with embodiments of the present disclosure. The package 100 depicted and described herein comprises the advantageous heat-dissipating properties along with the flexibility afforded by utilizing a single-gage leadframe.

Figure 1:
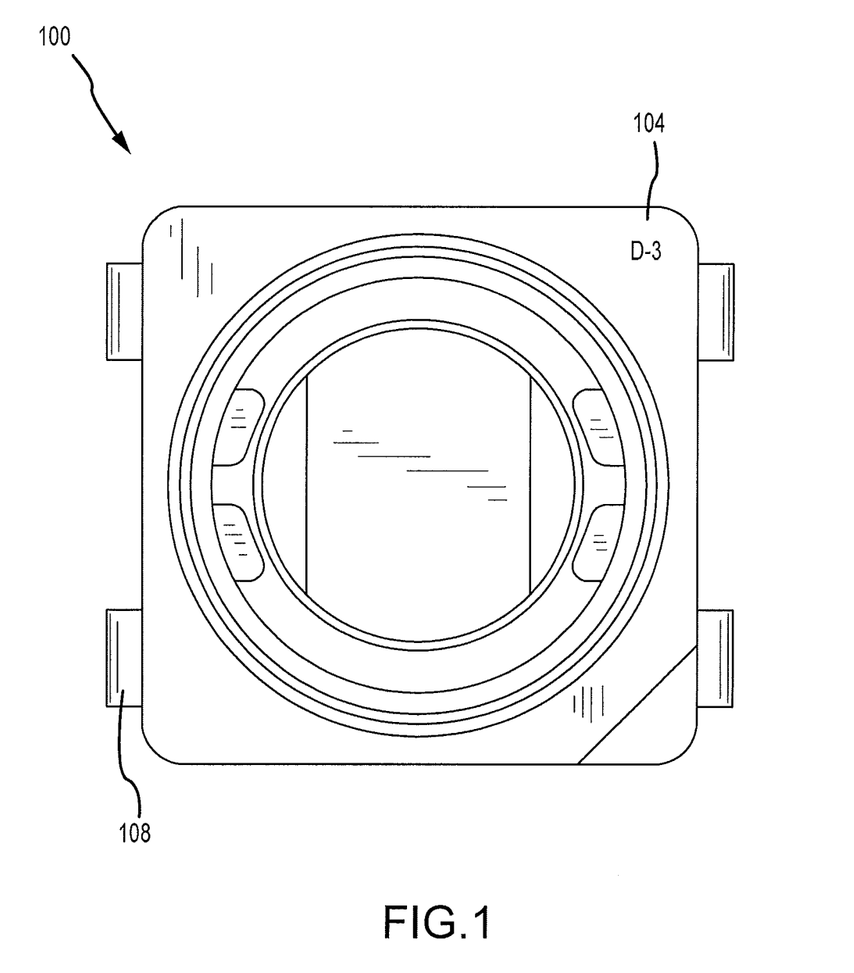
FIG. 1 is a top plan view of a light source package in a first configuration in accordance with embodiments of the present disclosure.
Figure 2A:
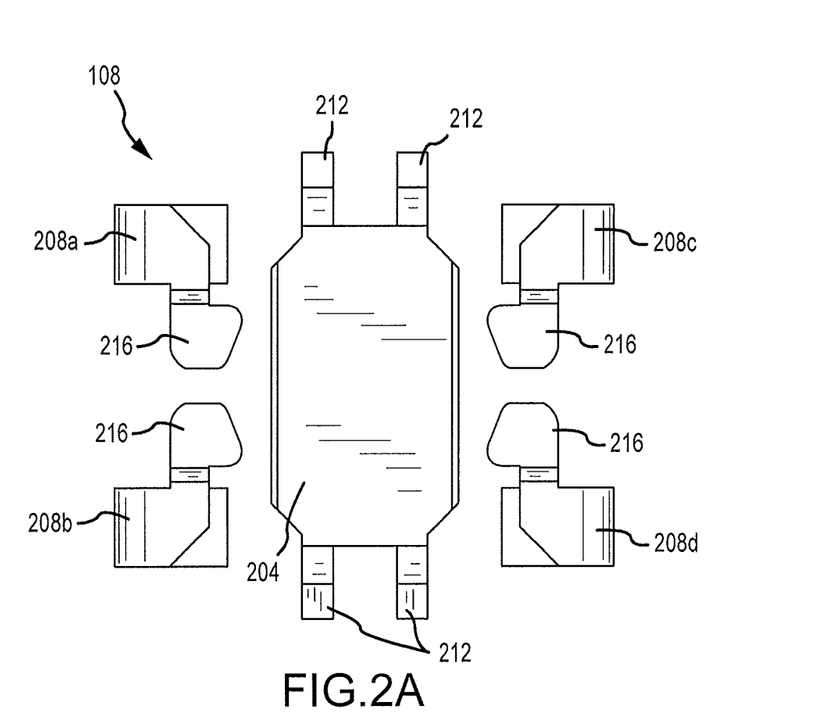
FIG. 2A is a top plan view of a first type of leadframe in accordance with embodiments of the present disclosure.
Figure 2B:
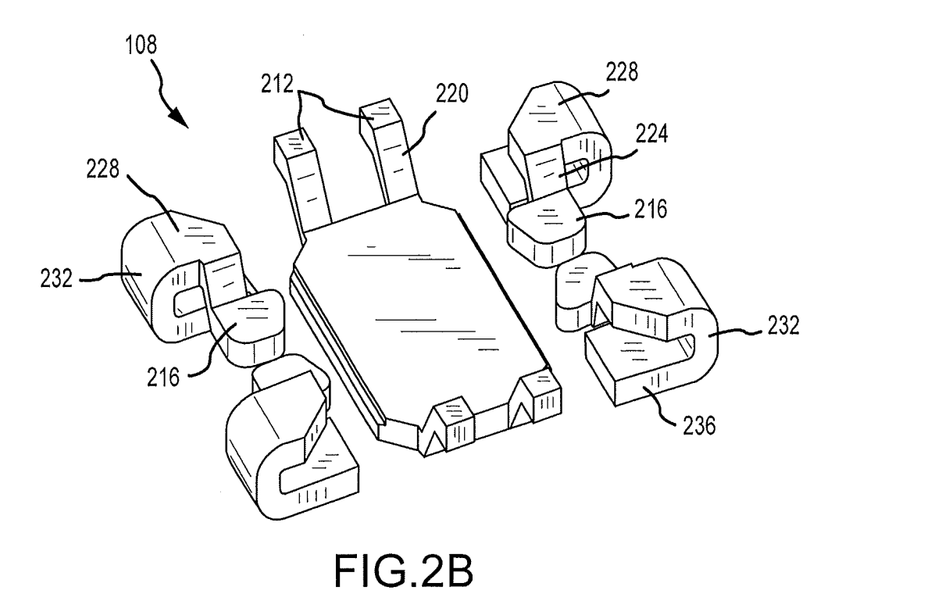
FIG. 2B is a top isometric view of the leadframe depicted in FIG. 2A.
Figure 3:
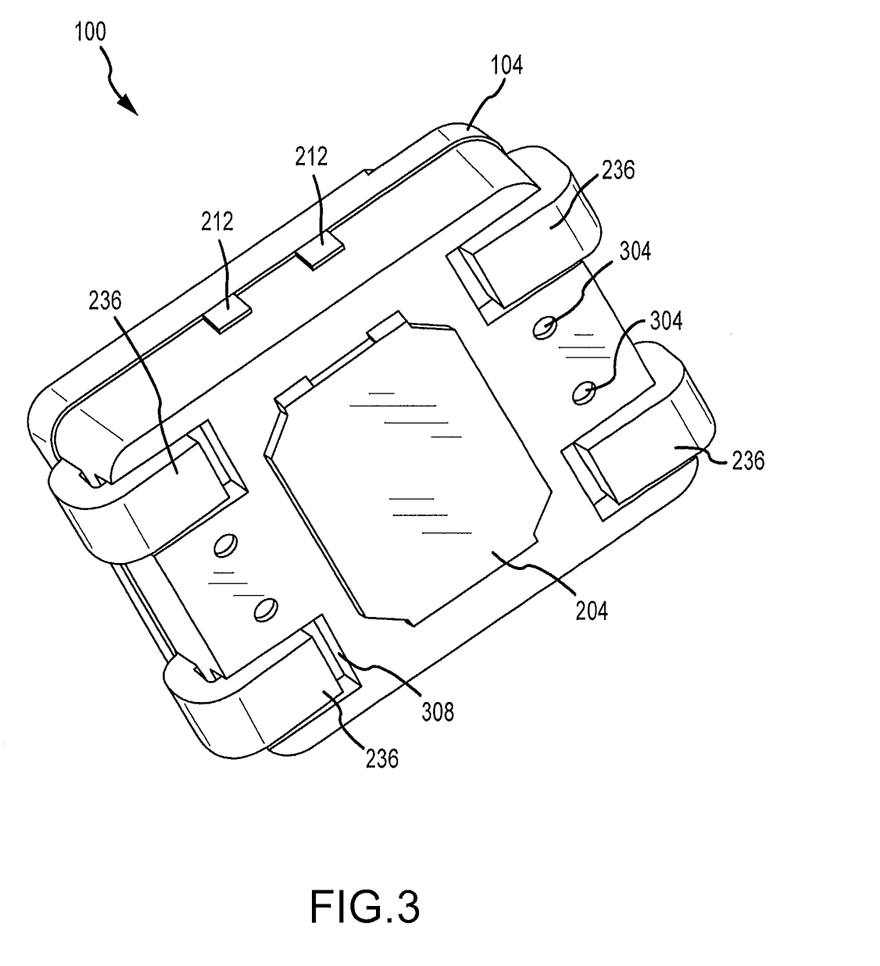
FIG. 3 is a bottom isometric view of the light source package depicted in FIG. 1.

FIGS. 1-3 depict a first configuration of a light source package 100 having a vertical (north-south) leadframe configuration. The light source package 100 is depicted as comprising a housing 104 and a leadframe 108. In some embodiments, the housing 104 may be constructed of a non-conductive material while the leadframe 108 may be constructed of a conductive material.

In some embodiments, the housing 104 may be constructed of any polymer or combination of polymers using extrusion, machining, micro-machining, molding, injection molding, or a combination of such manufacturing techniques. As a non-limiting example, the housing 104 may comprise polyphthalamide (PPA), silicone, PCT, etc. Accordingly, the terms non-conductive mold, PPA, PPA mold, and pre-mold may be used synonymously herein to refer to the element 104 that separates the conductive components of the leadframe 108.

The leadframe 108 may comprise a number of leads that are configured to carry electrical current to and from a light source or plurality of light sources. As shown in FIGS. 2A and 2B, the leadframe 108 may comprise a bonding pad 204 and one or more leads 208a-d. In some embodiments, each of the leads 208a-d are electrically isolated from the bonding pad 204 as well as being electrically isolated from one another. The bonding pad 204 and the leads 208a-d may each be constructed of a single-gage leadframe. Accordingly, the thickness of the bonding pad 204 may be similar or identical to the thickness of un-folded portions each lead 208a-d.

The bonding pad 204 is depicted as being a generally planar surface that is configured to support one or more light sources thereon. In some embodiments, the bonding pad 204 comprises a main bonding portion and one or more external tabs 212 that extend away from the main bonding portion. The external tabs 212 may be connected to the main bonding portion of the bonding pad 204 via an arm 220. The external tabs 212 are depicted as being generally raised relative to the bonding pad 204, but it should be appreciated that such a configuration is not required. The external tabs 212 may be co-planar with the bonding pad 204 or located below the bonding pad 204. In some embodiments, the external tabs 212 may be initially formed on a common plane with the main bonding portion of the bonding pad 204, but then a punching step may be performed to form the arms 220 and make the external tabs 212 elevated relative to the main bonding portion.

Each of the leads 208a-d are depicted as comprising a stitch pad 216, an arm 224, an upper portion 228, a folded portion 232, and a lower portion 236. The stitch pad 216 of a lead 208 may correspond to a location where wire bonds can be established. Specifically, a first end of a wire may be bonded to the stitch pad 216 and a second end of the wire may be bonded to a light source that is mounted on the bonding pad 204. The stitch pad 216 may, therefore, be positioned on a plane other than the bonding pad 204. Specifically, the stitch pad 216 may be elevated relative to the bonding pad 204, but not as elevated as the external tabs 212, for instance. The stitch pads 216 are depicted as having a non-uniform shape, but it should be appreciated that any type of shape or combination of shapes may be used for the stitch pads 216 without departing from the scope of the present disclosure.

The stitch pad 216 of a lead 208 is connected to the upper portion 228 of the lead 208 via an arm 224. Much like the art 220 of the bonding pad 204, the arm 224 of the lead 208 may be formed with a punching step, which makes the upper portion 228 elevated relative to the stitch pad 216. The stitch pad 216 may, in some embodiments, correspond to the highest portion of the lead 208, meaning that the arm 224 may not be necessary. One advantage of using the arm 224 is that the stitch pad 216 may be positioned on a plane closer to the plane on which the bonding pad 204 is located. This means that the amount of wire needed to electrically connect a light source (bonded on the bonding pad 204) to the lead 208 via the stitch pad 216 is less than if the stitch pad 216 were on the same plane as the upper portion 228.

As shown in FIG. 1, only a portion of the stitch pad 216 may be exposed or not covered by the housing 104 whereas all of the upper portion 228 of the lead 208 may be covered by the housing 104.

The upper portion 228 of the lead 208 may be connected to the lower portion 236 via a folded portion 232. The lower portion 236 may correspond to the part of the lead 208 that is connectable to another circuit. For instance, the light source package 100 may be connected to a PCB via the lower portions 236, which may be configured for soldering or the like. As shown in FIG. 3, the folded portions 232 of the leads 208 and the lower portions 236 may be exposed or not covered by the housing. Specifically, the folded portions 232 may initially extend away from the bonding pad 204 around the outer sides of the housing 104 while the lower portions 236 may be exposed at a bottom of the housing 104. The lower portions 236 may extend back toward the bonding pad 204. In some embodiments, the lower portions 236 may be substantially co-planar with the bonding pad 204 or they may be located on a plane below the bonding pad 204.

It can also be seen in FIGS. 2A and 2B and the lower portion 236 of a lead 208 may be positioned at least partially underneath the upper portion 228. By providing the lower portion 236 at least partially underneath the upper portion 228, the overall size of the package 100 can be reduced (e.g., because there is no need for additional surface area to accommodate a non-overlapping upper portion 228).

Referring back to FIG. 3, additional details of the leadframe 108 interacting with the housing 104 is depicted in accordance with embodiments of the present disclosure. The housing 104 is depicted as further including one or more vias 304 and one or more recesses 308 on its outer periphery. In particular, the one or more vias 304 enable a stronger attachment to occur between the housing 104 and leadframe 108. In some embodiments, via 304 may be positioned substantially underneath a stitch pad 216, although such a configuration is not necessarily required.

One function provided by the external tabs 212 is to hold the leadframe 108 to the larger sheet of single-gage metal during the manufacturing process, at least until a trimming step is performed and the package is singulated away from the main single-gage metal. The traversal of the arms 220 and tabs 212 through the housing 104 and ultimate exposure of the external tabs 212 out of the side of the housing 104 further enhances the mechanical interlocking that occurs between the leadframe 108 and the housing 104. In some embodiments, the external tabs 212 are trimmed so as to be substantially flush or even with the side surfaces of the housing 104. The recesses 308 are configured to accommodate the lower portions 236 of the leads 208, thereby reducing the overall size of the package 100.

FIG. 3 also shows how the bottom surface of the bonding pad 204 is exposed outside of the lower portion of the housing 104. Exposure of the bonding pad 204 outside of the housing 104 enables the bonding pad 204 to be attached directly (or indirectly) to a second level PCB or similar layer of circuitry, metal, etc. In some embodiments, the lower portions 236 of the leads 208 are electrically connected to a PCB to enable operation of the light source within the light source package 100. The bonding pad 204, on the other hand, may also facilitate the transfer of heat away from the light source on its top surface to the second level PCB attached to the bottom surface of the bonding pad 204. This direct connection between the bonding pad 204 and another electrical and/or heat conducting element enables heat to be transferred away from the light source, thereby increasing its operational lifetime. In some embodiments, the bonding pad 204 may be configured to be soldered to a lower level PCB or a metal heat sink, thereby creating a continuous thermal path from the light source on the top surface of the bonding pad 204 to the lower level PCB or metal heat sink.

Figure 4:
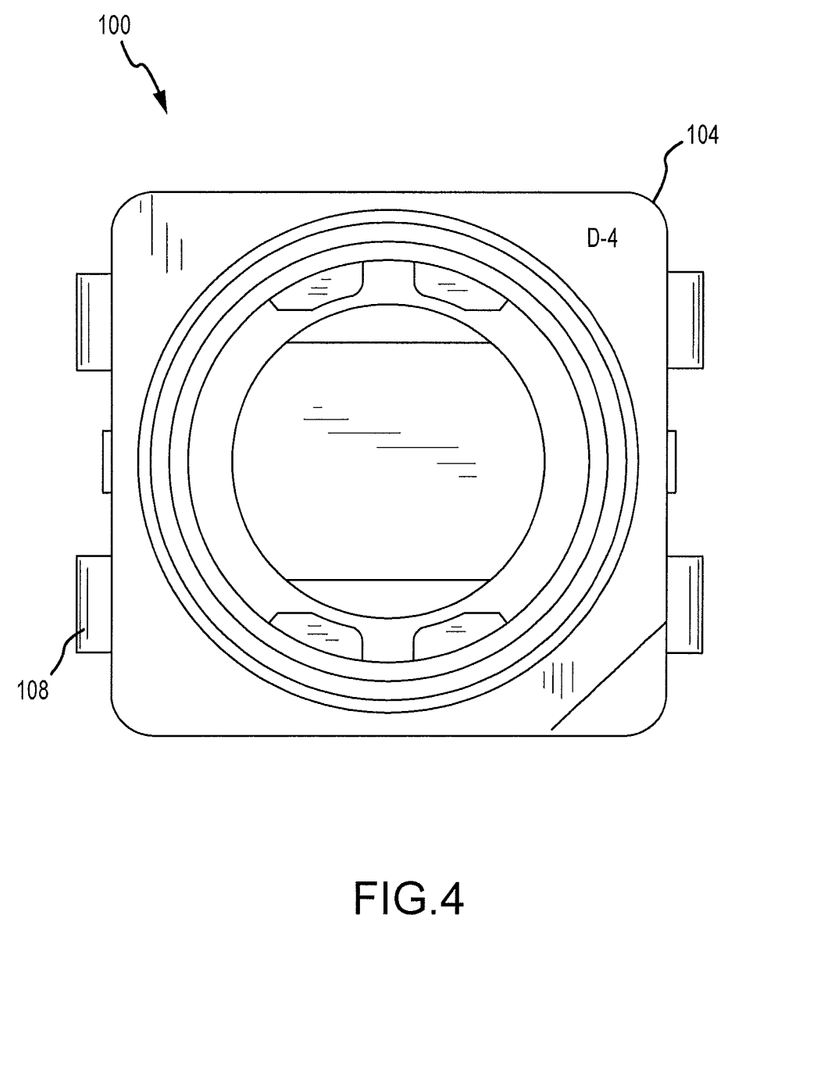
FIG. 4 is a top plan view of a light source package in a second configuration in accordance with embodiments of the present disclosure.
Figure 5A:
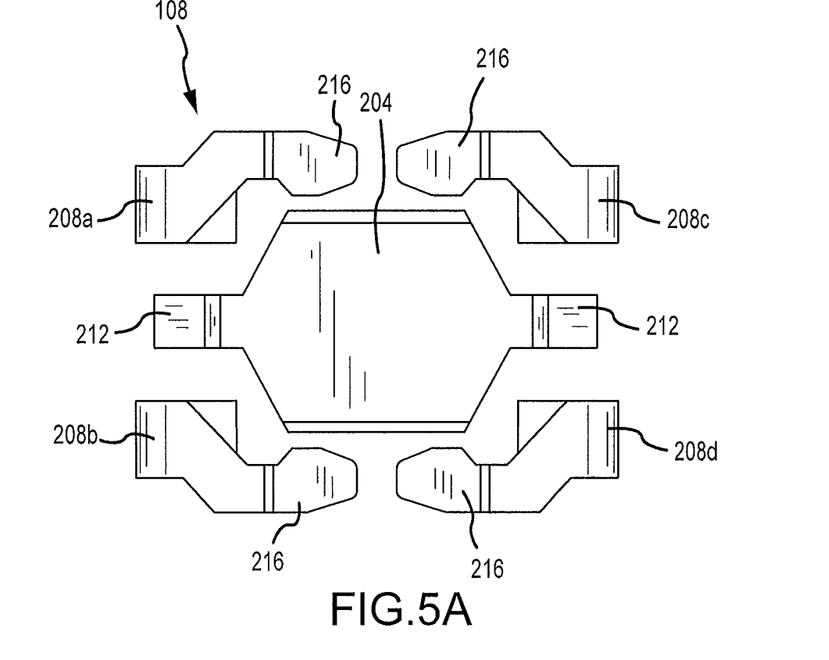
FIG. 5A is a top plan view of a second type of leadframe in accordance with embodiments of the present disclosure.
Figure 5B:
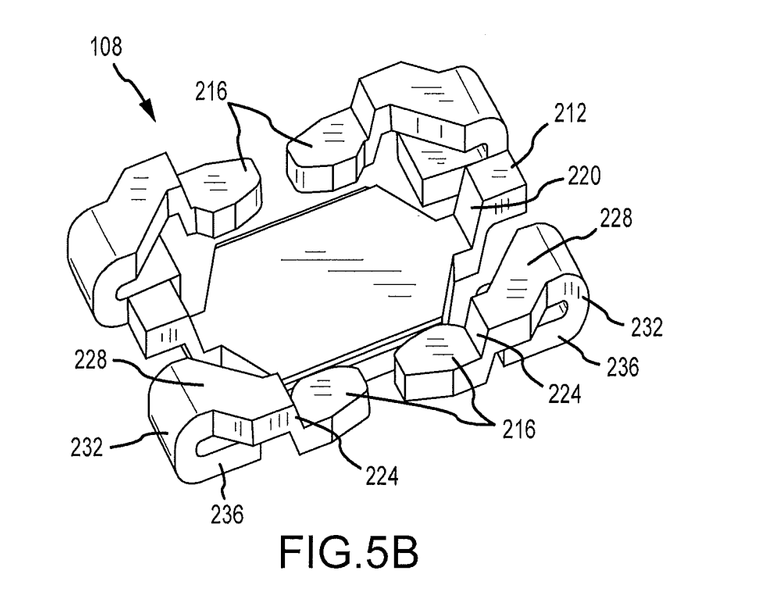
FIG. 5B is a top isometric view of the leadframe depicted in FIG. 5A.

FIGS. 4 and 5 depict an alternative configuration of a light source package 100. Specifically, the package 100 is depicted as having a horizontal (east-west) leadframe configuration. The package 100 components are similar to those depicted in FIGS. 1-3, but the relative configuration of such components are different. For instance, the bonding pad 204 is depicted as having only two external tabs 212 as opposed to four external tabs 212 in the vertical leadframe configuration. As another example, the stitch pads 216 may not necessarily extend toward the bonding pad 204 as in the vertical leadframe configuration. Rather, the stitch pads 216 may extend longitudinally with respect to the bonding pad 204. As yet another example, the external tabs 212 may be exposed from the housing 104 on the same side as the folded portions 232 of the leads 208.

Figure 6A:
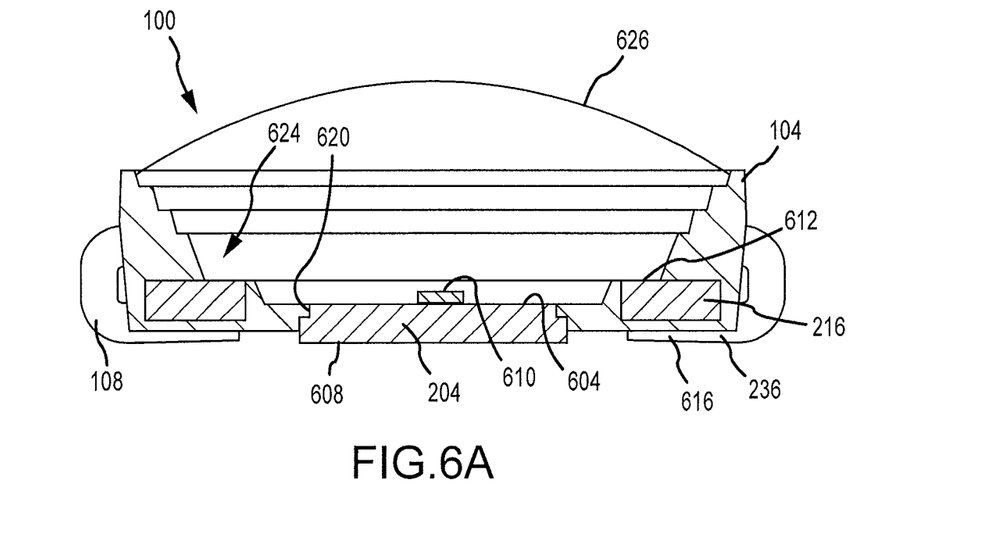
FIG. 6A is a cross-sectional view of a light source package in accordance with embodiments of the present disclosure.
Figure 6B:
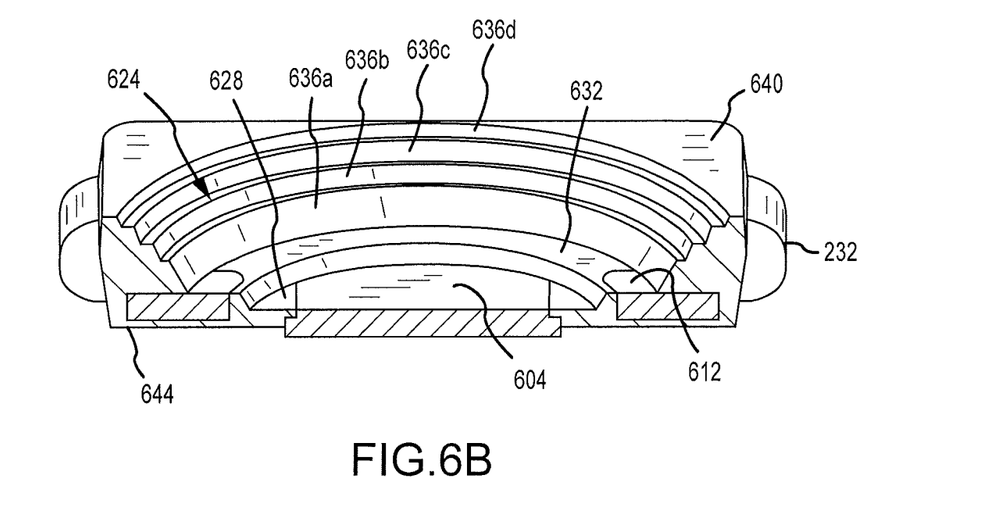
FIG. 6B is a cross-sectional isometric view of the light source package depicted in FIG. 6A.

With reference now to FIGS. 6A and 6B, additional details of the housing 104 and its interaction with the leadframe 108 will be described in accordance with embodiments of the present disclosure. The bonding pad 204 is shown to comprise a top surface 604 with at least one light source 640 mounted thereon and a bottom surface 608 that opposes the top surface 604. The lower portion 236 of each leadframe 208 also comprises a circuit-attachment surface 616. In some embodiments, the circuit-attachment surface 616 and bottom surface 608 of the bonding pad 204 are substantially co-planar and each may be configured to be soldered, bonded, or otherwise connected to an external circuit or PCB.

The light source 640 may correspond to one or more light sources without departing from the scope of the present disclosure. In some embodiments, the light source 640 comprises an LED or array of LEDs. Where an LED or similar light source is used, one bonding wire can be connected to an anode of the light source 640 whereas another bonding wire is connected to a cathode of the light source 640. In some embodiments, the anode and cathode are both on the top light-emitting surface of the light source 640. In some embodiments, the anode and cathode are on opposite surfaces of the light source 640. Such a light source 640 may be constructed using known flip-chip manufacturing processes or any other known method for establishing both an anode and cathode on a common side of a light source 640. In either configuration, by connecting the anode and cathode of the light source 640 to two different conductive leads 208, an electrical potential can be applied to the anode and cathode of the light source 640 thereby energizing the light source 640 and causing it to emit light. Other suitable light sources include, without limitation, a laser diode, an array of laser diodes, an array of LEDs, or a combination of laser diodes and LEDs.

As can be seen in FIG. 6A, there is an uninterrupted thermal path between the top surface 604 of the bonding pad 204 and the bottom surface 608 of the bonding pad 204. Moreover, because the leadframe 108 may be constructed of a single-gage leadframe material, the overall distance between the top surface 604 and the bottom surface 608 can be anywhere between 0.10 mm and 0.50 mm, and more specifically anywhere between 0.15 mm and 0.20 mm. This minimal distance can help to facilitate thermal conductivity from the light source 640 to a heat sink or PCB in thermal communication with the bottom surface 608 of the bonding pad 204. The utilization of a leadframe material having such a thickness also favors design flexibility (e.g., because the leadframe 108 can be punched and folded without cracking) and reduced cost as compared to thicker leadframe options.

It can also be seen that the stitch pads 216 have an exposed area 612 within a reflector cup 624 of the housing 104. The exposed area 612 may correspond to an area where wire bonding can be achieved, thereby enabling the light source 640 to be electrically connected to one or more of the leads 208. Once connected to a lead 208, the light source 640 can be controlled by controlling current flowing into and/or out of the leads 208 with an external driver circuit.

FIG. 6A also depicts the fact that the stitch pad 216 does not overlap with the lower portion 236 of the lead 208. Thus, the lower surface of the stitch pad 216 may be on a plane lower than a top surface of the lower portion 236. Furthermore, the exposed area of 612 of the stitch pad 216 may be substantially elevated relative to the top surface 604 of the bonding pad 204. Such a configuration effectively minimizes the distance between the top of the light source 640 and the exposed area 612, thereby minimizing the amount of wire needed to attach the two surfaces.

The bonding pad 604 is also shown to include a step 620. The step 620 may correspond to any type of taper or mechanical etching that enhances the mechanical interlocking between the bonding pad 204 and the housing 104. The step 620 may be established by trimming, etching, and/or machining the leadframe 108.

The housing 104, in some embodiments, may further comprise the reflector cup 624. The reflector cup may be generally conical in some embodiments, where the narrower portion of the reflector cup 624 is toward the bonding pad 204 while the wider portion of the reflector cup 624 is toward the top of the housing 104. In the depicted embodiment, the reflector cup 624 is shown to include a reflector cup bottom 628, a wire-bonding level 632, and a plurality of discrete levels 636a-d. The reflector cup 624 opens at a top face 640 of the housing 104 whereas the bottom face 644 of the housing 104 is substantially closed except for the vias 304.

The reflector cup 624 may be configured to reflect light emitted by the light source 640, thereby enhancing the overall light output of the light source package 100. In some embodiments, the top surface 604 of the bonding pad 204 is substantially co-planar with the reflector cup bottom 628. A transition wall having a generally conical shape may connect the reflector cup bottom 624 to the wire-bonding level 632. In some embodiments, the wire-bonding level 632 of the housing 104 is substantially co-planar with the exposed area 612 of the stitch pad 216. Moreover, the wire-bonding level 632 may be configured to circumvent or surround the entire reflector cup bottom 628.

Moving up from the wire-bonding level 632, the reflector cup 624 may comprise a smooth and conically-shaped surface. Alternatively, as shown in FIGS. 6A and 6B, the reflector cup 624 may comprise a plurality of discrete levels 636a-d. Although four discrete levels 636a-d are depicted, it should be appreciated that the reflector cup 624 may have a greater or lesser number of discrete levels without departing from the scope of the present disclosure.

It should also be appreciated that the reflector cup 624 may be formed in any uniform or non-uniform shape (e.g., circular, elliptical, trapezoidal, square, rectangular, triangular, etc.) depending upon the desired light distribution. In some embodiments, the area of the reflector cup 624 is larger its top surface as compared to the area of the reflector cup bottom 62. This means that the reflector cup 624 gets larger as it extends away from the light source 640. In some embodiments, the top surface of the reflector cup 624 extends above the top surface of the light source 640

In some embodiments, some or all of the inner surface of the reflector cup 624 is coated with a reflective material. Specifically, since the reflector cup 624 is composed of same material as the housing 104, it may be desirable to increase the reflectivity of the reflector cup 624 to improve the optical performance of the package 100. In some embodiments, the inner surface of the reflector cup 624 is coated with a reflective material such as tin, aluminum, etc. to increase the reflectivity of the reflector cup 624. The reflective material may be deposited in the reflector cup via any known deposition process such as electroplating, ALD, CVD, magnetron sputtering, and the like.

An encapsulant 626 may also be contained within the reflector cup 624. In some embodiments, the encapsulant 626 may entirely fill the reflector cup 624, whereas in other embodiments the reflector cup 624 may only be partially filled with an encapsulant 626. Any number of materials may be suitable for use as the encapsulant 124. Examples of such materials include, without limitation, epoxy, silicone, a hybrid of silicone and epoxy, phosphor, a hybrid of phosphor and silicone, an amorphous polyamide resin or fluorocarbon, glass, plastic, or combinations thereof. Furthermore, the encapsulant 626 may be formed to have one or more light-shaping elements incorporated therein. Specifically, the encapsulant 626 can be formed to have one or more curved surfaces which shape the light emitted by the light source 640 in a desired pattern. As a non-limiting example, the encapsulant 626 may comprise a dome, a curved surface, a series of curved surfaces, or any other type of surface for directing light in a predetermined pattern. Accordingly, the encapsulant 626 can serve multiple purposes of (1) protecting the light source 640 and/or bonding wires from physical damage, (2) hermetically sealing the light source 640 and/or bonding wires, and/or (3) shaping light emitted by the light source 640.

The discrete levels 636a-d of the reflector cup 624 may further provide the ability to fill and separate distinct layers of encapsulant 626 within the reflector cup 624. For instance, a first type of encapsulant (e.g., a first material) may fill the reflector cup 624 from the reflector cup bottom 628 to the top of the first level 636a. A second type of encapsulant (e.g., a second material) may rest atop the first material and may fill the reflector cup 624 from the bottom of the second level 636b to the top of the second level 636b. A third type of encapsulant (e.g., a third material) may rest atop the second material and may fill the reflector cup 624 from the bottom of the third level 636c to the top of the third level. Finally, a fourth type of encapsulant (e.g., a fourth material) may rest atop the third material and may entirely fill the fourth level 636d of the reflector cup 624 as well as extend above the housing 104 to form a curved or domed surface.

Continuing the above example, the first material may correspond to a clear silicone, the second material may correspond to a first phosphor-filled layer, the third material may correspond to a second phosphor-filled layer, and the fourth material may correspond to a clear/phosphor mixture. The second phosphor-filled layer may comprise a higher concentration of phosphor than the first phosphor-filled layer. Furthermore, the clear silicone layer of the first material advantageously separates the phosphor layers from sources of heat (e.g., the light source 640, bonding wires, leads 208, the bonding pad 204, etc.). By separating the phosphor from the sources of heat, the lifetime of the light source package 100 can be increased (e.g., because phosphor degradation can be minimized or managed).

Figure 7A:
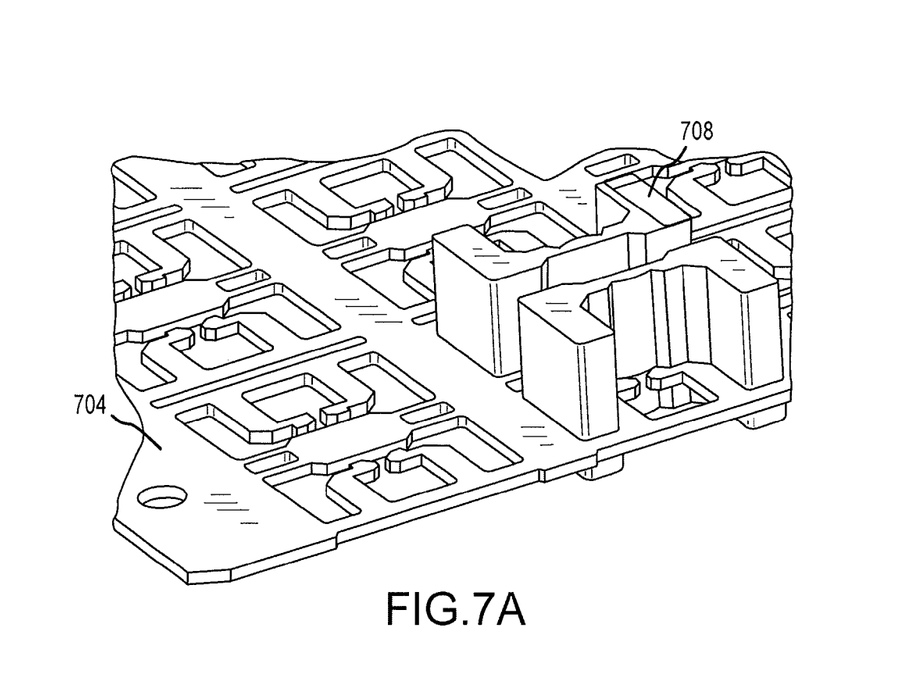
FIG. 7A depicts a first stage in a manufacturing process for mass-producing light source packages in accordance with embodiments of the present disclosure.

With reference now to FIGS. 7A-E and 8, a method of manufacturing one or a plurality of light source packages 100 will be described in accordance with embodiments of the present disclosure. The method begins when a single-gage leadframe sheet 704 is received (step 804). In some embodiments, the single-gage leadframe sheet 704 may comprise a thickness of approximately 0.10 mm to 0.50 mm, and more particularly a thickness of approximately 0.15 mm to 0.20 mm. As shown in FIG. 7A, the single-gage leadframe sheet 704 may be punched with a first punch 708 to remove at least some portions of the leadframe 108 and form the various features of the leadframe 108 (e.g., bonding pad 204, leads 208, etc.) (step 808). Of course, the single-gage leadframe sheet 704 may be trimmed, machined, etched, or the like instead of being punched.

Figure 7B:
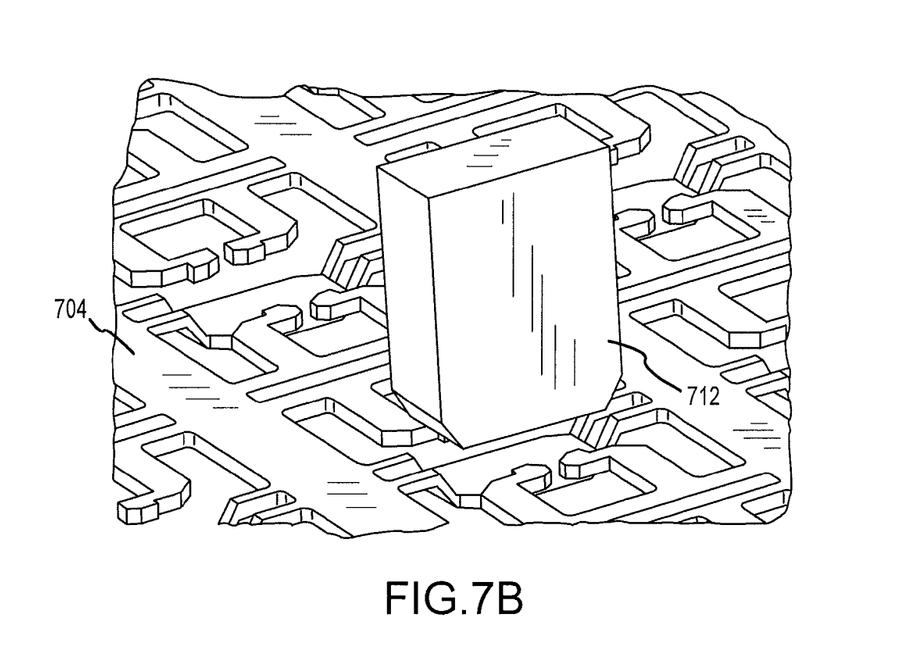
FIG. 7B depicts a second stage in a manufacturing process for mass-producing light source packages in accordance with embodiments of the present disclosure.

Following the first punch process, a second punch process is performed (step 812) as shown in FIG. 7B. Specifically, a bonding pad punch 712 is used to press the bonding pad 204 down and away from the rest of the single-gage leadframe sheet 704. In this step, the arms 220 of the external tabs 212 are formed.

Figure 7C:
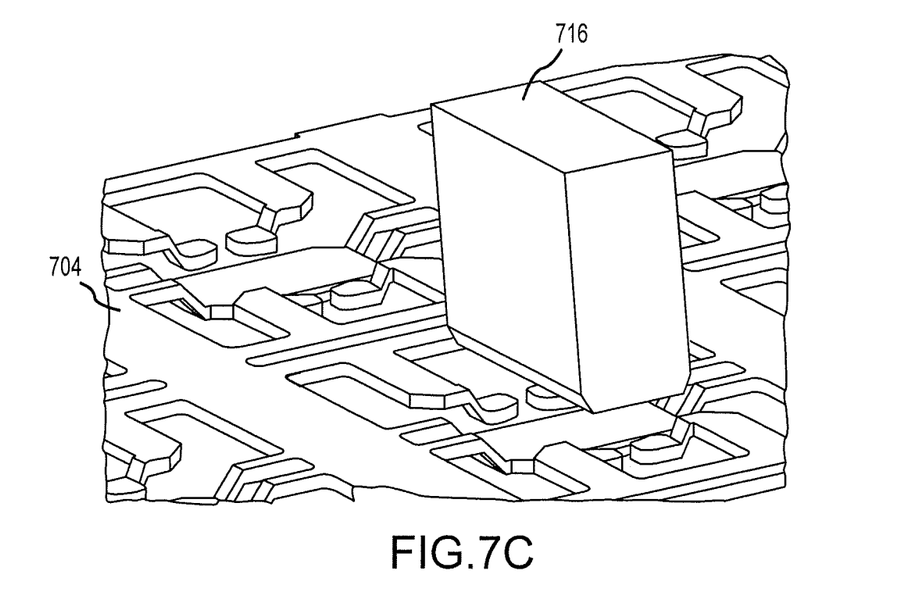
FIG. 7C depicts a third stage in a manufacturing process for mass-producing light source packages in accordance with embodiments of the present disclosure.

Thereafter, a third punch process is performed (step 816) as shown in FIG. 7C. Specifically, a stitch pad punch 716 is utilized to position the stitch pads 216 as desired relative to the bonding pad 204. In this step, the arms 224 are formed. In some embodiments, the stitch pads 216 are not punched as far as the bonding pad 204, which leaves the stitch pads 216 slightly elevated relative to the bonding pad 204. At this point, the single-gage leadframe sheet 704 has components in three different planes.

Figure 7D:
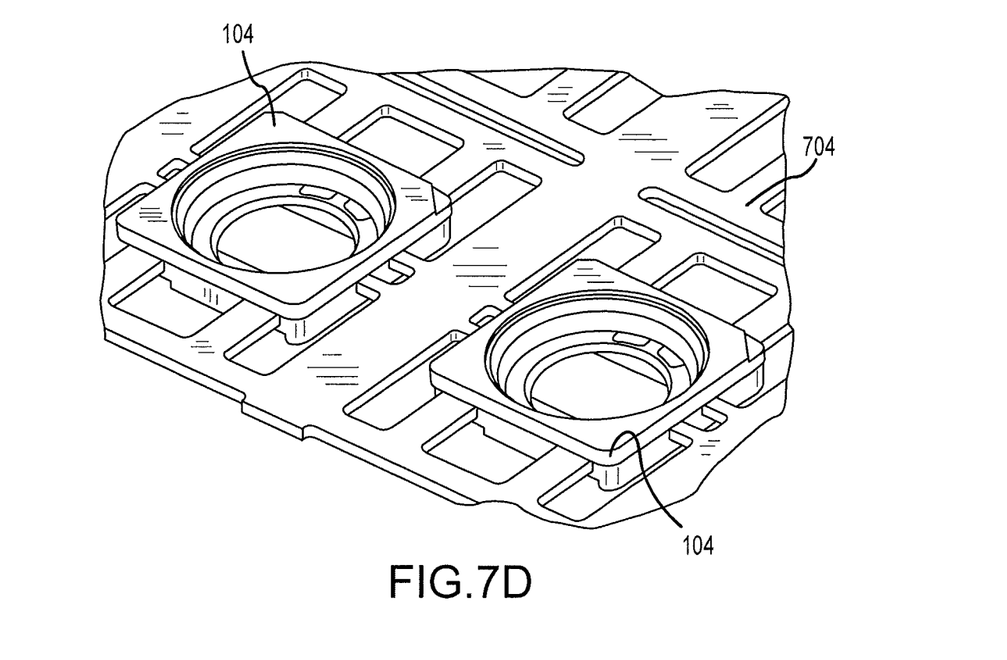
FIG. 7D depicts a fourth stage in a manufacturing process for mass-producing light source packages in accordance with embodiments of the present disclosure.

Following the third punch process, the housing 104 is formed around the components of the leadframe 108 (step 820) as shown in FIG. 7D. In particular, the material of the housing 104 may be molded or otherwise formed around the leadframe 108. In some embodiments, an injection molding process may be used to form the housing 104 around the leadframe 108.

Figure 7E:
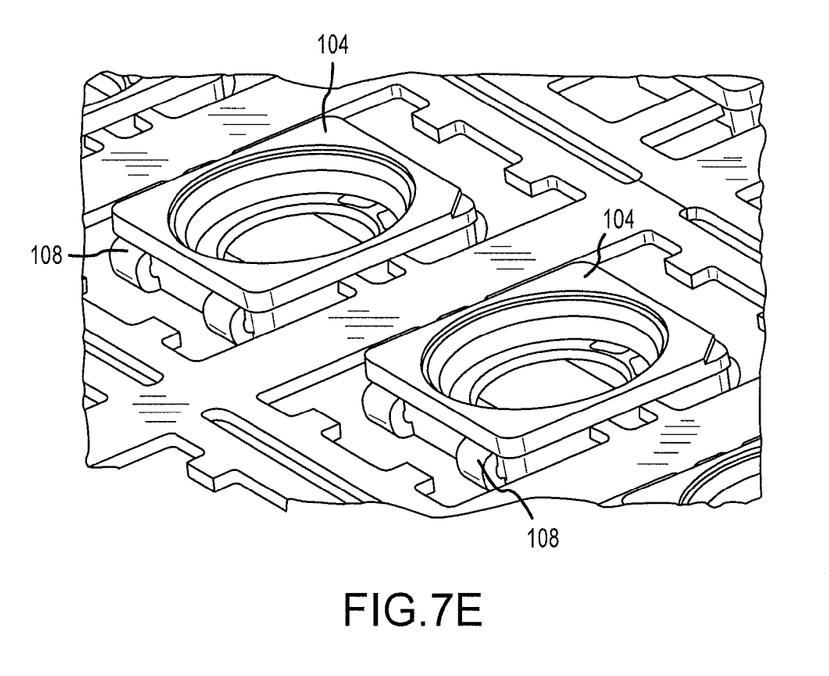
FIG. 7E depicts a fifth stage in a manufacturing process for mass-producing light source packages in accordance with embodiments of the present disclosure.
Figure 8:
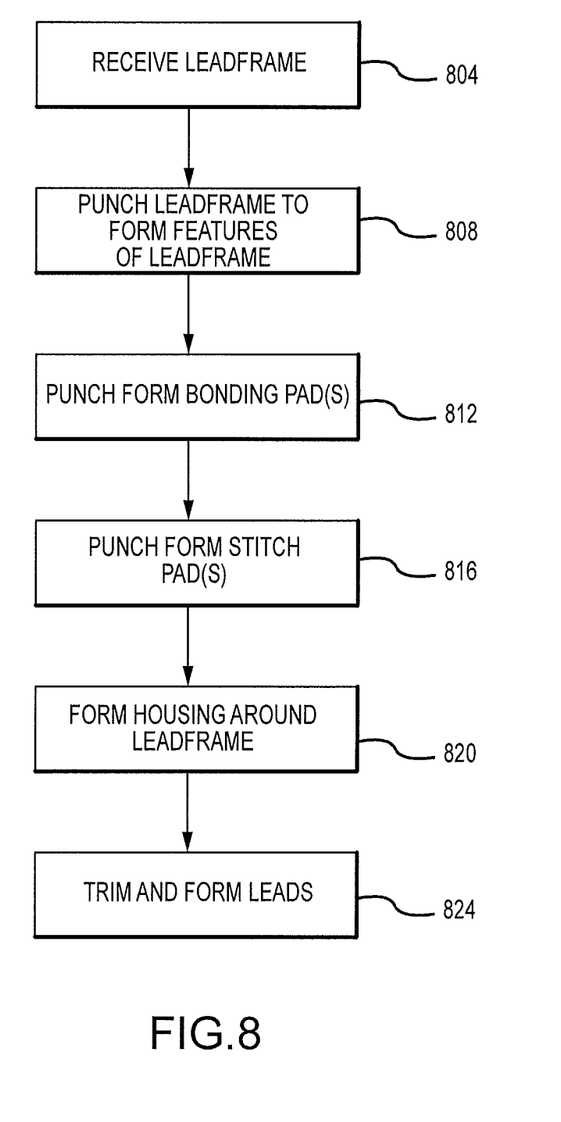
FIG. 8 is a flow diagram depicting a method of manufacturing a light source package in accordance with embodiments of the present disclosure.

Once the housing 104 has been formed, the leads 208 and external tabs 212 may be trimmed, thereby separating the light source package 100 from the single-gage leadframe sheet 704. Furthermore, the leads 208 of the leadframe 108 may be formed (e.g., bent, folded, etc.) so that they wrap around the housing 104 in a desired fashion (step 824). FIG. 7E shows how multiple light source packages 100 can be obtained from a single manufacturing process that employs a single-gage leadframe sheet 704.

Specific details were given in the description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. An optical device, comprising:
   a single-gage leadframe comprising a bonding pad having a top surface and an opposing bottom surface, a first conductive lead, and a second conductive lead, wherein at least one of the first and second conductive leads comprise a stitch pad configured for wire bonding that is elevated relative to the top surface of the boding pad;
   a non-conductive housing that physically separates the bonding pad from both the first conductive lead and the second conductive lead as well, at least a portion of the bonding pad bottom surface being exposed through a bottom face of the housing, and at least a portion of the stitch pad being exposed through the housing;
   a reflector cup comprising a wire-bonding level that is positioned above a reflector cup bottom, the reflector cup further comprising a plurality of discrete levels positioned above the wire-bonding level, each level in the plurality of discrete levels comprising a different circumference; and
   a light source mounted to the top surface of the bonding pad.

2. The device of claim 1, wherein the non-conductive housing comprises the reflector cup, the reflector cup bottom being substantially co-planar with the top surface of the bonding pad.

3. The device of claim 2, wherein a thickness of the bonding pad between the top surface and the opposing bottom surface is greater than or equal to a thickness of the housing between the reflector cup bottom and the bottom face.

4. The device of claim 2, wherein the wire-bonding level is substantially co-planar with an exposed area of at least one of the first conductive lead and the second conductive lead.

5. The device of claim 1, further comprising:
   a first encapsulant material that fills the reflector cup at least between the reflector cup bottom and the wire-bonding level, the first encapsulant material being substantially devoid of phosphor; and
   a second encapsulant material that is separated from the reflector cup bottom by the first encapsulant material, the second encapsulant material comprising phosphor and at least partially filling one of the plurality of discrete levels positioned above the wire-bonding level.

6. The device of claim 5, further comprising a third encapsulant material that is separated from the first encapsulant material by the second encapsulant material, the third encapsulant material comprising a greater density of phosphor than the second encapsulant material.

7. The device of claim 6, further comprising a fourth encapsulant material that is separated from the second encapsulant material by the third encapsulant material, the fourth encapsulant material extending beyond the reflector cup and comprising at least one light-shaping feature.

8. The device of claim 1, wherein the light source comprises a Light Emitting Diode (LED).

9. The device of claim 1, wherein the single-gage leadframe is between about 0.10 mm and 0.50 mm in thickness.

10. A package for a light source, comprising:
    a non-conductive housing having a top face, a bottom face, and a plurality of side faces; and
    a leadframe partially contained within the non-conductive housing, the leadframe comprising:
      a bonding pad with a top surface and bottom surface, the bottom surface of the bonding pad being exposed through the bottom face of the housing;
      a first conductive lead having a first stitch pad configured for wire bonding, the first stitch pad comprising a bonding surface that is not co-planar with the top surface of the bonding pad, wherein the first conductive lead comprises an upper portion connected to the first stitch pad via an arm as well as a lower portion connected to the upper portion via a folded portion, wherein the lower portion is configured for attachment to an external circuit, wherein the lower portion and folded portions wrap around outer surfaces of the housing, wherein the lower portion at least partially underlies the upper portion, and wherein the stitch pad does not overlap with either of the upper portion and the lower portion; and
      a second conductive lead having a second stitch pad configured for wire bonding, the second stitch pad comprising a bonding surface that is not co-planar with the top surface of the bonding pad.

11. The package of claim 10, wherein the housing further comprises a reflector cup having a reflector cup bottom, the top surface of the bonding pad being exposed via the reflector cup bottom.

12. The package of claim 11, wherein a distance between the reflector cup bottom and the bottom face of the housing is less than or equal to a distance between the top surface and bottom surface of the bonding pad.

13. The package of claim 10, wherein the bonding pad comprises at least one external tab that is exposed via one of the plurality of side faces of the housing and wherein an arm connects the bonding pad with the at least one external tab.

14. The package of claim 13, wherein the arm connecting the external tab with the bonding pad is longer than the arm connecting the upper portion of the first conductive lead with the first stitch pad.

15. The package of claim 10, wherein the leadframe is between about 0.10 mm and 0.50 mm in thickness.

16. A package for a light source, comprising:
a non-conductive housing having a top face, a bottom face, and a plurality of side faces; and
a leadframe partially contained within the nonconductive housing, the leadframe comprising:
a bonding pad with a top surface and bottom surface, the bottom surface of the bonding pad being exposed through the bottom face of the housing;
a first conductive lead having a first stitch pad configured for wire bonding, the first stitch pad comprising a bonding surface that is not co-planar with the top surface of the bonding pad;
a second conductive lead having a second stitch pad configured for wire bonding, the second stitch pad comprising a bonding surface that is not co-planar with the top surface of the bonding pad;
a first encapsulant material that fills a reflector cup formed in the housing at least between a reflector cup bottom and the first conductive lead, the first encapsulant material being substantially devoid of phosphor; and
a second encapsulant material that is separated from the reflector cup bottom by the first encapsulant material, the second encapsulant material comprising phosphor and at least partially filling one of a plurality of discrete levels each having a different circumference and being positioned above the first conductive lead.

17. The package of claim 16, further comprising a third encapsulant material that is separated from the first encapsulant material by the second encapsulant material, the third encapsulant material comprising a greater density of phosphor than the second encapsulant material.

18. The package of claim 16, wherein the bonding pad comprises at least one external tab that is exposed via one of the plurality of side faces of the housing and wherein an arm connects the bonding pad with the at least one external tab.

19. The package of claim 18, wherein the arm connecting the external tab with the bonding pad is longer than the arm connecting the upper portion of the first conductive lead with the first stitch pad.

20. The package of claim 16, wherein the leadframe is between about 0.10 mm and 0.50 mm in thickness.

\* \* \* \* \*